(12) United States Patent
Ohkuni

(10) Patent No.: US 7,268,083 B2
(45) Date of Patent: Sep. 11, 2007

(54) PLASMA ETCHING APPARATUS AND PLASMA ETCHING PROCESS

(75) Inventor: Mitsuhiro Ohkuni, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 249 days.

(21) Appl. No.: 11/009,005

(22) Filed: Dec. 13, 2004

(65) Prior Publication Data
US 2005/0199343 A1  Sep. 15, 2005

(30) Foreign Application Priority Data
Mar. 10, 2004  (JP) .............. 2004-066692

(51) Int. Cl.
*H01L 21/461* (2006.01)
*H01L 21/302* (2006.01)

(52) U.S. Cl. .............. 438/706; 438/707; 438/708; 438/714

(58) Field of Classification Search .............. None
See application file for complete search history.

(56) References Cited

U.S. PATENT DOCUMENTS 7,048,869 B2 * 5/2006 Takahashi et al. .......... 216/70
2003/0157242 A1 * 8/2003 Nakano et al. .............. 427/8
2004/0149208 A1 * 8/2004 Shiraishi et al. ........... 118/715

FOREIGN PATENT DOCUMENTS

| JP | 2-224242 A | 9/1990 |
|---|---|---|
| JP | 7-254498 A | 10/1995 |
| JP | 8-339897 | 12/1996 |
| JP | 10-275694 | 10/1998 |
| JP | 10-302997 A | 11/1998 |
| JP | 2002-75963 A | 3/2002 |

* cited by examiner

*Primary Examiner*—Duy-Vu N Deo
(74) *Attorney, Agent, or Firm*—McDermott, Will & Emery LLP (57) ABSTRACT

A plasma etching apparatus includes: a chamber capable of reducing pressure; a substrate support provided inside the chamber to place a substrate; a first electrode which is arranged outside and in proximity to the chamber and to which high frequency power is applied to generate plasma of an etching gas in the chamber; and a second electrode comprising a plurality of separated electrodes which are arranged between the chamber and the first electrode and to each of which high frequency power is applied independently.

12 Claims, 5 Drawing Sheets

PLASMA ETCHING APPARATUS AND PLASMA ETCHING PROCESS

CROSS-REFERENCE TO RELATED APPLICATIONS

This non-provisional application claims priority under 355 U.S.C. § 119(a) on Patent Application No. 2004-066692 filed in Japan on Mar. 10, 2004, the entire contents of which are hereby incorporated by reference.

BACKGROUND OF THE INVENTION (a) Field of the Invention

The present invention relates to a plasma etching apparatus and a plasma etching process mainly used for patterning an electrode material film of a ferroelectric capacitor. In particular, the invention relates to a plasma etching apparatus for fine patterning of the electrode material film while suppressing particle generation and a plasma etching process using the same.

(b) Description of Related Art

With the increase in density, functionality and speed of semiconductor integrated circuit devices in recent years, techniques of using a nonvolatile memory (e.g., FeRAM (Ferroelectric Random Access Memory)) have been proposed. In the nonvolatile memory, a ferroelectric film such as of SBT (strontium bismuth tantalate) or PZT (lead zirconic titanate) is used for a capacitor insulating film. Further, a simple substance film such as of platinum (Pt) or iridium (Ir) is used as a capacitor electrode material and a plasma dry etching technique mainly with a chlorine gas is employed for fine patterning thereof. However, it is extremely difficult to dry etch these electrode material films. The reason therefor is explained below.

Table 1 shows etching reaction products generated through a reaction between various kinds of electrode material films and a chlorine-containing etching gas, together with their boiling points.

TABLE 1

| Substance | Boiling point |
|---|---|
| $PtCl_2$ | 581° C. |
| $PtCl_4$ | 370° C. |
| $IrCl_3$ | 763° C. |
| $SiCl_4$ | 58° C. |

As shown in Table 1, if the electrode material film is a polysilicon film which is used for a general integrated circuit, $SiCl_4$ is generated as an etching reaction product. Since $SiCl_4$ has a boiling point as low as about 58° C., the product is easily gasified in an etching reaction chamber and emitted outside.

On the other hand, $PtCl_2$, $PtCl_4$ and $IrCl_3$, which are products generated by a reaction between Pt or Ir and the chlorine-containing etching gas, have remarkably high boiling points as compared with $SiCl_4$, and therefore these products are hard to gasify (vaporize). Accordingly, these reaction products do not go out of the chamber during the etching and remain adhered to the chamber wall. This will be a cause of particle generation in the later step. Especially in a plasma etching apparatus, a top plate of the chamber is generally opposed to a semiconductor wafer to be etched. Therefore, the reaction product adhered to the top plate may drop in the form of particles onto the wafer during the etching process to cause a defect in the fine pattern. This is a serious problem in manufacturing the semiconductor integrated circuits.

Among commonly used inductively coupled dry etching apparatuses, there is an apparatus comprising a Faraday shield electrode (hereinafter referred to as an FS electrode) arranged between the outer wall of the chamber and an inductively coupled coil (hereinafter referred to as an ICP coil) arranged to surround the outer wall to generate plasma of an etching gas in the chamber. In this apparatus, a voltage or high frequency power is applied to the FS electrode to prevent an insulating material forming the inner wall of the chamber from being etched by the plasma (for example, see Japanese Unexamined Patent Publication No. HEI 10-275694).

Figure 5A:
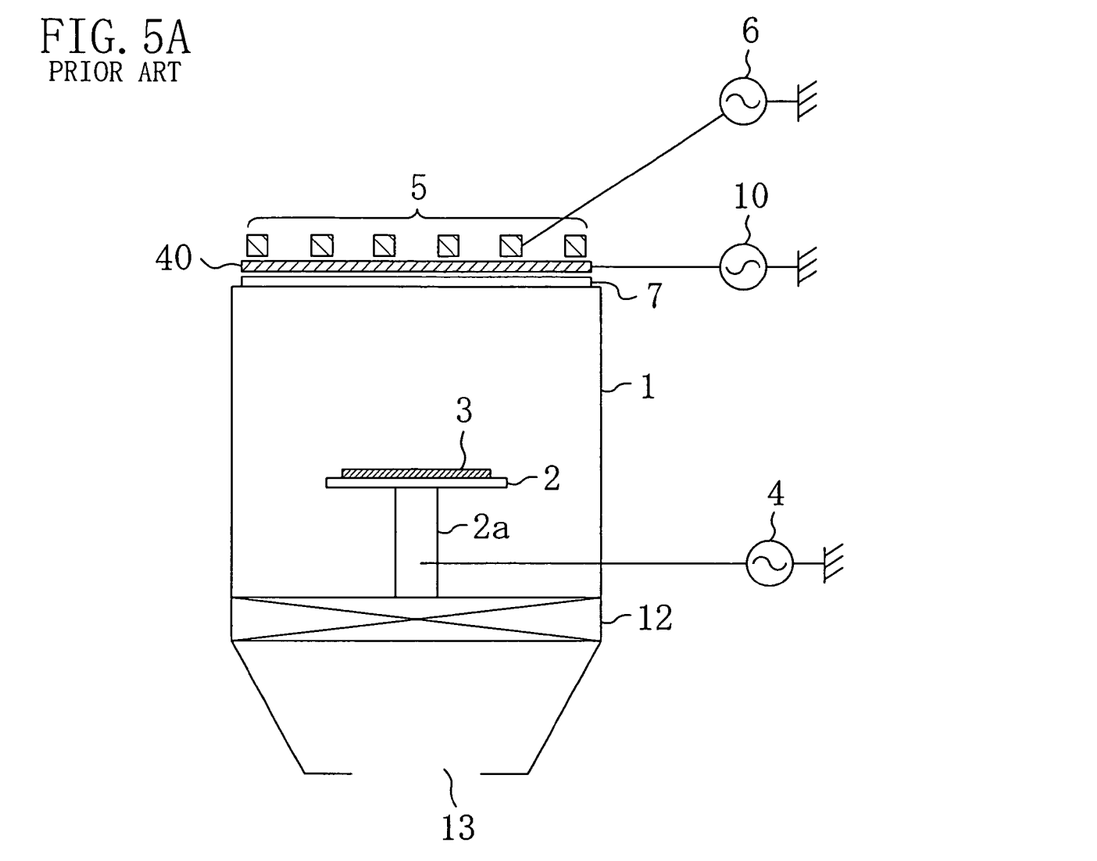
FIG. 5A is a view illustrating a schematic configuration of a conventional plasma etching apparatus and FIG. 5B is a plan view illustrating an FS electrode of the etching apparatus shown in FIG. 5A.

FIG. 5A shows a schematic configuration of an inductively coupled plasma treatment apparatus (etching apparatus) provided with a conventional FS electrode. As shown in FIG. 5A, an electrode 2 serving also as a wafer support is arranged inside a chamber 1 for performing plasma treatment such as dry etching. The electrode 2 is installed on the bottom of the chamber 1 via a support member 2a and a wafer 3 to be plasma-treated is placed on the electrode 2. Further, a high frequency bias voltage is applied to the electrode 2 from a high frequency power source 4.

At the top of the chamber 1, a top plate 7 made of quartz or ceramic is arranged to be opposed to the electrode 2 or the wafer 3. An inductively coupled coil 5 (hereinafter referred to as an ICP coil 5) for generating plasma in the chamber 1 is provided in proximity to the top surface of the top plate 7, i.e., the outer wall of the chamber 1. A high frequency voltage is supplied to the ICP coil 5 from a high frequency power source 6. Further, an FS electrode 40 having the aforesaid function is inserted between the ICP coil 5 and the top plate 7.

During the etching of the wafer 3, a suitably adjusted high frequency voltage is applied to the FS electrode 40 from a high frequency power source 10, which prevents the insulating material, especially forming the top plate 7, from being etched by plasma ion impact.

Figure 5B:
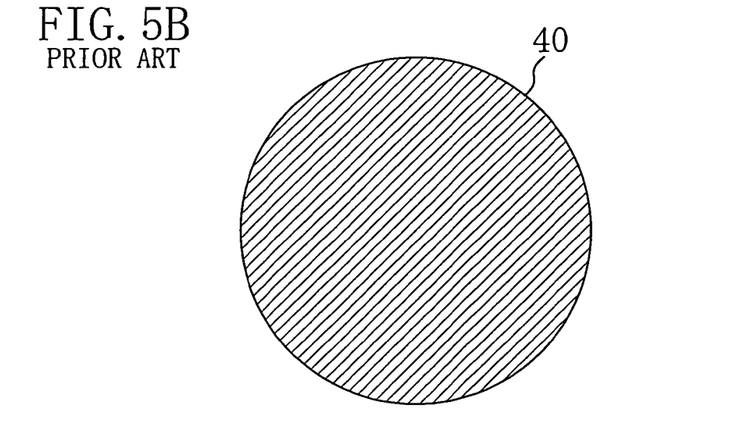

FIG. 5B is a plan view of the FS electrode 40 of the etching apparatus shown in FIG. 5A. In general, the FS electrode 40 is circular when viewed in plan as shown in FIG. 5B and is plate-shaped when viewed in section as shown in FIG. 5A.

The etching apparatus of FIG. 5A has an exhaust port 13 at the bottom thereof. Releasing a gate valve 12 brings a pressure-reduced state (a state where the pressure is lower than normal (atmospheric) pressure) in the chamber 1.

In contrast to the apparatus of FIG. 5A, in an apparatus not having the FS electrode, i.e., the Faraday shield, the generated plasma and the inductively coupled coil are coupled not only inductively but also capacitively. Accordingly, the insulating material such as quartz serving as the chamber wall is etched by the plasma. Especially in the vicinity of the inner wall of the chamber immediately below the ICP coil, electrons and ions in the plasma are accelerated in the direction vertical to the chamber inner wall by the high voltage applied to the coil at high frequency. Since the mass of the electrons is far smaller than that of the ions, the chamber inner wall is collided with the electrons more predominantly than the ions and thereby to be negatively charged. As a result, the ions carrying the opposite charge are attracted to the negatively charged area and the chamber wall material is etched by the ion impact.

On the other hand, in the etching apparatus configured as shown in FIG. 5A, the FS electrode 40 is provided between the ICP coil 5 and the insulating material for the inner wall of the chamber 1 and a voltage is applied to the FS electrode 40, thereby preventing the chamber wall from being etched. The FS electrode 40 is provided essentially for preventing the chamber inner wall from being wasted by the etching. If the voltage applied to the FS electrode 40 is optimized, an optimum capacitive coupling component is surely obtained at the area in the chamber 1 made of the insulating material and immediately below the ICP coil 5. In this case, a reaction product generated during the etching and adhered to the chamber inner wall can be etched by making use of a self-bias voltage due to the capacitive coupling component. That is, in the above-mentioned ideal case, the etching apparatus of FIG. 5A allows etching, while preventing the insulating material forming the chamber inner wall from being etched and controlling the adhesion of the reaction product generated during the plasma etching to some extent (i.e., reducing the generation of particles).

BRIEF SUMMARY OF THE INVENTION

In a fine ferroelectric nonvolatile memory in which the minimum design size for the circuit is generally 0.18 µm or smaller, however, a film of layered structure made of conductive materials containing Pt, Ir or both of them has come to be used as the capacitor electrode material film. Accordingly, a mixture such as $PtCl_4$ or $IrCl_3$ is generated as the reaction product during the etching of the multilayered film. Therefore, the reaction product is more prone to remain in the chamber as compared with the case of etching the electrode film made of a single material, which is employed for a capacitor of a memory with a relatively larger pattern size. In the apparatus of FIG. 5A, the reaction product adheres to the surface of the top plate 7 serving as the chamber inner wall. Furthermore, the reaction product is apt to adhere in larger thickness to a center part of the top plate 7 than to other parts. The reason therefor is considered as follows. Due to the relative arrangement of the wafer 3 and the top plate 7 where the surface of the wafer 3 is opposed to the center part of the top plate 7 as shown in FIG. 5A, the distance between the surface of the wafer 3 and the center part of the top plate 7 is the smallest and the distance between the surface of the wafer 3 and the periphery of the top plate 7 is relatively large. Accordingly, the reaction product released from the wafer surface through the etching reaches the center part of the top plate 7 with more ease.

As described above, if the reaction product adhered to the chamber inner wall has a nonuniform thickness distribution (unevenness), the reaction product may possibly remain in the center part of the top plate 7 even if optimization is given to the voltage value applied to the FS electrode 40, i.e., the bias voltage component applied to the insulating chamber inner wall such as the top plate 7 immediately below the ICP coil 5 (and induced by the capacitive coupling). Where the reaction product remains adhered to the insulating chamber inner wall in this way, there is caused a problem in that particles are generated inside the chamber 1 and fall onto the wafer 3 to cause defects.

Further, in the conventional etching apparatus shown in FIG. 5A, the degree of adhesion of the reaction product is not specified by in-situ observation. In other words, it is unclear where and to what extent the reaction product actually adheres. Therefore, it is difficult to etch the reaction product enough by adjusting the voltage value applied to the FS electrode 40 during the etching.

Again in the conventional etching apparatus, part of the insulating material to which the reaction product is not adhered or adhered thinly, e.g., the periphery of the top plate 7, is excessively sputtered due to an excessive voltage component derived from the high frequency voltage applied to the FS electrode 40 (and caused by the capacitive coupling). This also brings about a problem of significant waste of the insulating material.

In view of the above, an object of the present invention is to prevent the insulating material forming the chamber inner wall from being etched and to suppress the particle generation derived from the reaction product remaining in the chamber.

To achieve the object, a first plasma etching apparatus according to the present invention comprises: a chamber capable of reducing pressure; a substrate support provided inside the chamber to carry a substrate; a first electrode arranged outside and in proximity to the chamber, to which high frequency power is applied to generate plasma comprising an etching gas in the chamber; and a second electrode comprising a plurality of separated electrodes arranged between the chamber and the first electrode, to each of which high frequency power is applied independently.

In the present invention, high frequency means a frequency not lower than 10 kHz and not higher than 10 GHz.

In the first plasma etching apparatus, the second electrode may be provided within the chamber wall.

In the first plasma etching apparatus, it is preferable that the substrate support is arranged such that the surface of the substrate carried thereon is opposed to the second electrode and the second electrode comprises the plurality of separated electrodes combined concentrically. In this case, the second electrode may comprise the plurality of separated electrodes each having a circular circumference.

A second plasma etching apparatus according to the present invention comprises: a chamber capable of reducing pressure; a substrate support provided inside the chamber to carry a substrate; a first electrode arranged outside and in proximity to the chamber, to which high frequency power is applied to generate plasma comprising an etching gas in the chamber; a second electrode arranged between the chamber and the first electrode, to which high frequency power is applied; and a drive mechanism for moving the second electrode between the chamber and the first electrode along a wall of the chamber.

A third plasma etching apparatus according to the present invention comprises: a chamber capable of reducing pressure; a substrate support provided inside the chamber to carry a substrate; a first electrode arranged outside and in proximity to the chamber, to which high frequency power is applied to generate plasma comprising an etching gas in the chamber; a second electrode arranged between the chamber and the first electrode, to which high frequency power is applied; a detection means for detecting an etching reaction product adhered to part of an inner wall of the chamber opposing to the second electrode; and a drive mechanism for moving the second electrode between the chamber and the first electrode along a wall of the chamber in response to an etching reaction product detection signal from the detection means.

A first plasma etching process according to the present invention is a plasma etching process using the first plasma etching apparatus according to the present invention. Specifically, the process comprises the steps of: placing a substrate provided with a film to be etched on the substrate support; introducing an etching gas in the chamber and applying high frequency power to the first electrode after the step of placing the substrate to generate plasma comprising the etching gas in the chamber; and etching the film to be etched with the plasma while applying high frequency power independently to each of the plurality of separated electrodes serving as the second electrode based on a thickness distribution of an etching reaction product adhered to part of an inner wall of the chamber opposing to the second electrode.

A second plasma etching process according to the present invention is a plasma etching process using the first plasma etching apparatus according to the present invention. Specifically, the process comprises the steps of: placing a substrate provided with a film to be etched on the substrate support; introducing an etching gas in the chamber and applying high frequency power to the first electrode after the step of placing the substrate to generate plasma comprising the etching gas in the chamber; etching the film to be etched with the plasma; and applying high frequency power independently to each of the plurality of separated electrodes serving as the second electrode based on a thickness distribution of an etching reaction product adhered to part of an inner wall of the chamber opposing to the second electrode after the step of etching the film to be etched.

In the first or second plasma etching process, it is preferable that, in the step of applying the high frequency power independently to each of the plurality of separated electrodes, uniform etching is carried out to the etching reaction product regardless of the thickness distribution of the etching reaction product.

A third plasma etching process according to the present invention is a plasma etching process using the second plasma etching apparatus according to the present invention. Specifically, the process comprises the steps of: placing a substrate provided with a film to be etched on the substrate support; introducing an etching gas in the chamber and applying high frequency power to the first electrode after the step of placing the substrate to generate plasma comprising the etching gas in the chamber; and etching the film to be etched with the plasma and simultaneously applying high frequency power to the second electrode while moving the second electrode along a wall of the chamber using the drive mechanism based on a thickness distribution of an etching reaction product adhered to part of an inner wall of the chamber opposing to the second electrode.

A fourth plasma etching process according to the present invention is a plasma etching process using the third plasma etching apparatus according to the present invention. Specifically, the process comprises the steps of: placing a substrate provided with a film to be etched on the substrate support; introducing an etching gas in the chamber and applying high frequency power to the first electrode after the step of placing the substrate to generate plasma comprising the etching gas in the chamber; and etching the film to be etched with the plasma and simultaneously detecting a thickness distribution of an etching reaction product adhered to part of an inner wall of the chamber opposing to the second electrode using the detection means and applying high frequency power to the second electrode while moving the second electrode along a wall of the chamber using the drive mechanism based on the detected thickness distribution.

In the third or fourth plasma etching process, it is preferable that, in the step of applying the high frequency power to the second electrode, uniform etching is carried out to the etching reaction product regardless of the thickness distribution of the etching reaction product.

In the first to fourth plasma etching processes, it is preferable that the film to be etched is a film containing at least a noble metal element or a platinum group element and the etching gas is a chlorine-containing gas.

As explained above, according to the present invention, the second electrode such as a Faraday shield electrode comprises a plurality of separated electrodes and a high frequency voltage is applied independently to each of the separated electrodes based on the thickness distribution of the reaction product adhered to the chamber inner wall. Or alternatively, with the second electrode being moved along the chamber wall, a high frequency voltage is applied depending on the thickness of the reaction product adhered to a position to which the second electrode has been moved. Therefore, the reaction product remaining in the chamber is etched enough while part of the chamber inner wall immediately below the first electrode such as an ICP coil is prevented from being etched. Accordingly, particle generation derived from the reaction product is suppressed while exerting an original function of the second electrode, i.e., the waste of the insulating material forming the chamber is prevented with reliability. Thereby, the plasma etching of the electrode material film is carried out at low costs with fewer defects. In particular, in manufacturing an electrode of a ferroelectric memory, the present invention shows a remarkable effect if applied to the etching of a noble metal film or a platinum group metal film which gives a reaction product whose boiling point is too high for easy vaporization, i.e., a reaction product hard to exhaust out of the chamber.

That is, the present invention relates to a plasma etching apparatus and a plasma etching process and is particularly effective if applied to a manufacturing process including patterning of an electrode material film of a ferroelectric capacitor.

DETAILED DESCRIPTION OF THE INVENTION

First Embodiment

Hereinafter, an explanation is given to a plasma etching apparatus and a plasma etching process according to a first embodiment of the present invention with reference to the drawings.

Figure 1A:
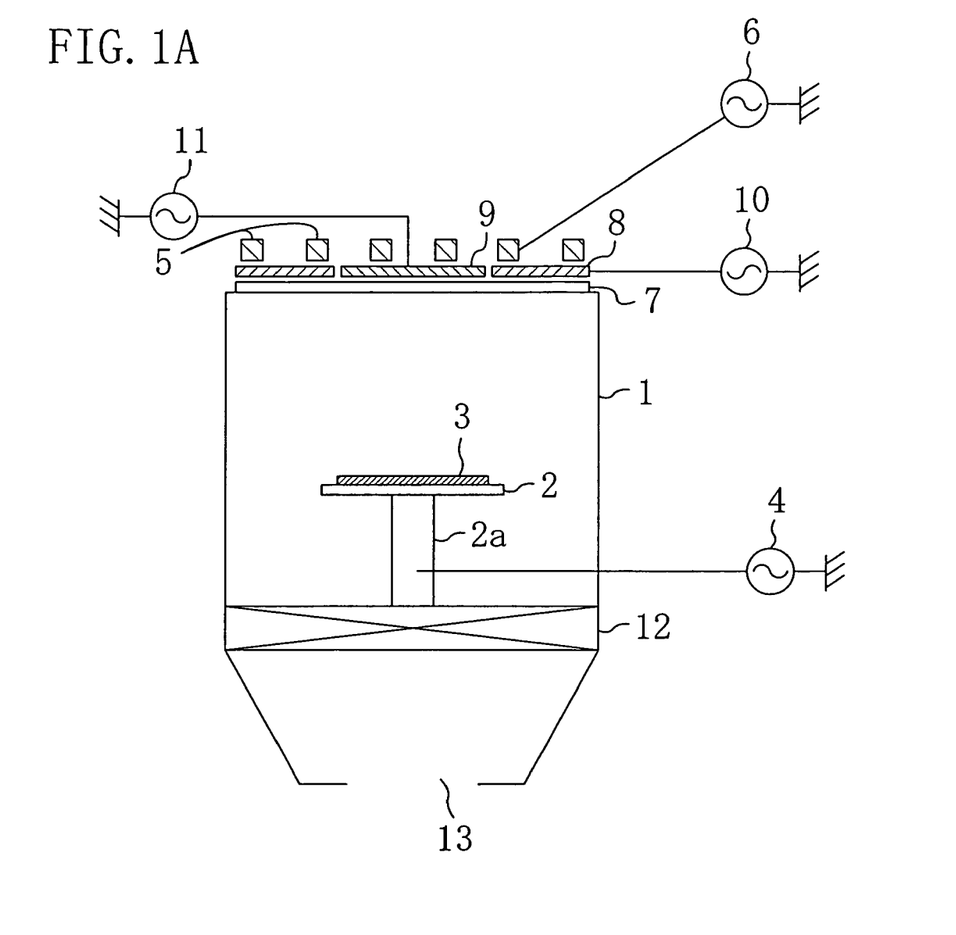
FIG. 1A is a view illustrating a schematic configuration of a plasma etching apparatus according to a first embodiment of the present invention and FIG. 1B is a plan view illustrating a first FS electrode and a second FS electrode of the etching apparatus shown in FIG. 1A.

FIG. 1A is a view illustrating a schematic configuration of the plasma etching apparatus according to the first embodiment of the present invention. The plasma etching apparatus of the present embodiment allows generation of plasma which couples inductively with an ICP coil and plasma which couples capacitively with an FS electrode. As to be described later, a major feature of the apparatus is that the FS electrode is separated in two or more.

More specifically, as shown in FIG. 1A, the apparatus of the present embodiment includes an electrode 2 serving also as a wafer support arranged in a chamber 1 for performing plasma treatment such as dry etching, i.e., a chamber 1 capable of reducing pressure. The electrode 2 is installed on the bottom of the chamber 1 via a support member 2a. Further, a wafer 3 to be plasma-treated is placed on the electrode 2 and a high frequency bias voltage is applied to the electrode 2 from a high frequency power source 4.

At the top of the chamber 1, a top plate 7 made of quartz or ceramic is provided to be opposed to the electrode 2 or the wafer 3. A high frequency electrode for generating major plasma to etch the wafer 3 in the chamber 1, i.e., an inductively coupled coil 5, is provided in proximity to the top surface of the top plate 7, i.e., an outer wall of the chamber 1. A high frequency voltage (high frequency power) is supplied to the ICP coil 5 from a high frequency power source 6.

A feature of the present embodiment is that two separated electrodes, specifically a first FS electrode 8 and a second FS electrode 9, are inserted between the ICP coil 5 and the top plate 7. The first and second FS electrodes 8 and 9 may be spaced from the top plate 7 or in contact with the top plate 7 depending on the material of the top plate 7. Further, the first and second FS electrodes 8 and 9 may be buried in the top plate 7 so as not to appear on the surface of the top plate 7 serving as the inner wall surface of the chamber.

During the etching of the wafer 3, a suitably adjusted high frequency voltage (high frequency power) is applied independently to the first and second FS electrodes 8 and 9 from high frequency power sources 10 and 11, respectively. This prevents the insulating material, especially forming the top plate 7, from being etched by plasma ion impact.

Figure 1B:
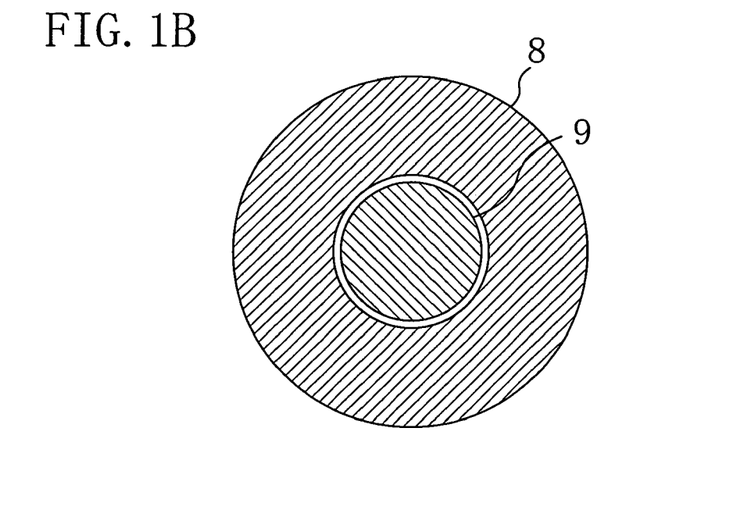

FIG. 1B is a plan view illustrating the first and second FS electrodes 8 and 9 of the etching apparatus shown in FIG. 1A. As shown in FIG. 1B, the first FS electrode 8 is ring-shaped when viewed in plan, while the second FS electrode 9 is disc-shaped when viewed in plan. Further, the first and second FS electrodes 8 and 9 are combined concentrically.

The etching apparatus shown in FIG. 1A has an exhaust port 13 at the bottom thereof. Releasing a gate valve 12 brings a pressure-reduced state in the chamber 1.

Hereinafter, a plasma etching process using the plasma etching apparatus of the present embodiment shown in FIG. 1A will be described with reference to the drawings.

Figure 2A:
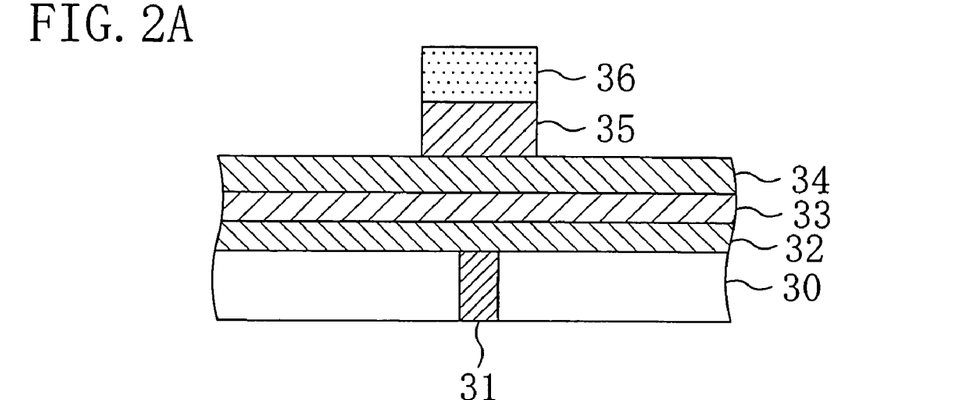
FIGS. 2A to 2C are sectional views illustrating the steps of manufacturing a capacitive element using a plasma etching process according to first and second embodiments of the present invention.
Figure 2B:
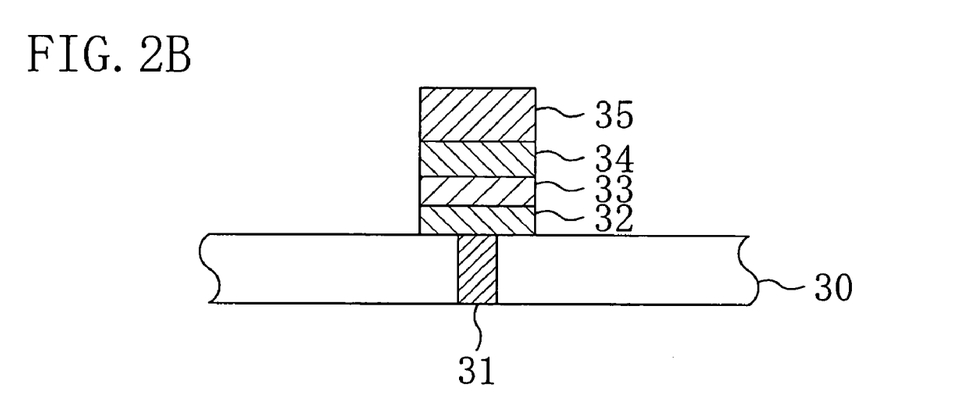
Figure 2C:
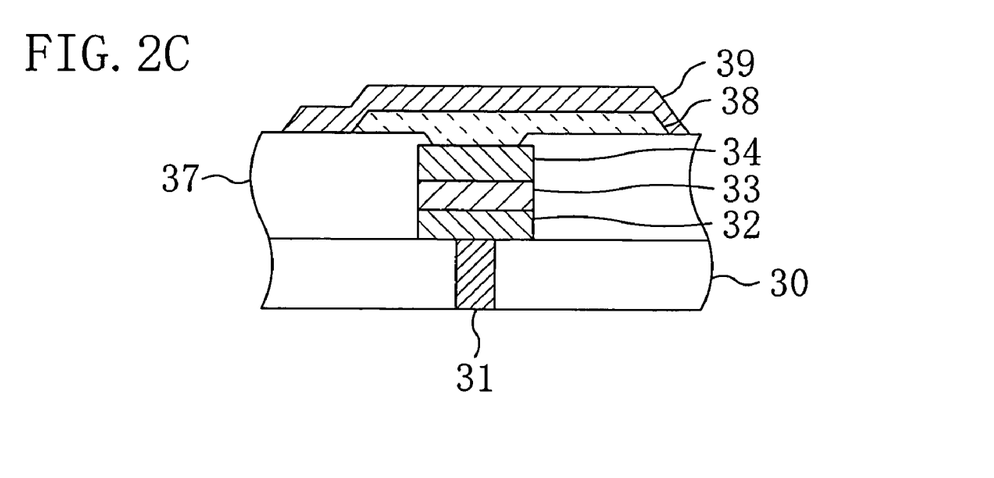

FIGS. 2A to 2C are sectional views illustrating the steps of manufacturing a capacitive element (memory capacity) of a ferroelectric memory cell in which a ferroelectric film comprising SBT or PZT is used as an insulating film for the capacitive element.

First, as shown in FIG. 2A, a SiN film 30 is formed on a semiconductor substrate (not shown) by CVD (chemical vapor deposition), for example. Then, a contact hole for connecting a memory capacitive electrode and the semiconductor substrate is opened in the SiN film 30, in which tungsten (W) is buried to form a contact plug 31. Then, a layered metal film containing a noble metal element or a platinum group element is formed over the contact plug 31 and the SiN film 30. More specifically, an Ir film 32 of 50 nm thickness, an $IrO_2$ film 33 of 50 nm thickness and a Pt film 34 of 100 nm thickness are deposited in this order. Further, a TiAlN film 35 of 100 nm thickness is deposited on the Pt film 34, which is then etched using a resist pattern 36 covering an electrode formation area as a mask. The Ir film 32 of 50 nm thick may be replaced with a layered film of a 100 nm thick TiAlN film and a 50 nm thick Ir film.

After the resist pattern 36 is removed as shown in FIG. 2B, the semiconductor substrate provided with the above-described layered metal film is placed on the electrode 2 in the chamber 1 of the plasma etching apparatus shown in FIG. 1A. Then, using the patterned TiAlN film 35 as a mask, the Pt film 34, $IrO_2$ film 33 and Ir film 32 are selectively etched in sequence with a gas mixture of chlorine ($Cl_2$) and oxygen ($O_2$). Thus, the Ir film 32, $IrO_2$ film 33 and Pt film 34 are patterned to form a lower capacitive electrode. Specific etching conditions are shown in Table 2.

TABLE 2

| | |
|---|---|
| ICP/RF power | 1500 W/200 W, 13.56 MHz |
| FS electrode power | Inner electrode: 300 W, 13.56 MHz |
| | Outer electrode: 200 W, 12.56 MHz |
| $Cl_2/O_2$ Flow rate | 100 ml/min (standard conditions)/ |
| | 250 ml/min (standard conditions) |
| Pressure | 2.0 Pa |
| Temperature of lower electrode | 50° C. |
| Number of particles increased | 0.2 µm or more: 20 particles |

As seen in Table 2, high frequency power is supplied independently to each of the first and second FS electrodes 8 and 9 in the dry etching step of the present embodiment. More specifically, high frequency power of 200 W (at a frequency of 12.56 MHz) is applied to the first FS electrode 8 (outer electrode) and high frequency power of 300 W (at a frequency of 13.56 MHz) is applied to the second FS electrode 9 (inner electrode) to perform the etching. In Table 2, the lower electrode corresponds to the electrode 2 of the plasma etching apparatus shown in FIG. 1A. That is, during the etching, high frequency power of 1500 W (at a frequency of 13.56 MHz) is applied to the ICP coil 5 and high frequency power of 200 W (at a frequency of 13.56 MHz) is applied to the lower electrode (electrode 2) so as to control energy of ions in the etching gas entering the substrate. Further, as shown in Table 2, $Cl_2$ gas and $O_2$ gas are introduced at flow rates of 100 ml/min (normal state) and 250 ml/min (normal state), respectively. The pressure in the chamber 1 is 2.0 Pa and the temperature of the lower electrode is 50° C.

Then, referring to FIG. 2C, the TiAlN film 35 is removed and then an interlayer insulating film 37 is formed over the whole surface of the semiconductor substrate to have a flat surface. Then, an opening is formed in the interlayer insulating film 37 to expose the surface of the Pt film 34. Subsequently, a ferroelectric film 38 serving as a capacitive insulating film is formed on the Pt film 34 and the interlayer insulating film 37 by patterning, and then an upper capacitive electrode 39 made of Pt, for example, is formed to cover the ferroelectric film 38.

According to the above process of manufacturing the memory capacitance element, in the step of etching the layered film of the Pt film 34, $IrO_2$ film 33 and Ir film 32 (see FIG. 2B), the high frequency power is applied independently to each of the first and second FS electrodes 8 and 9. At this time, the power applied to the second FS electrode 9 is higher than that applied to the first electrode 8. As described above, in the apparatus as shown in FIG. 1A in which the wafer 3 is opposed to the top plate 7 or the ICP coil 5 outside the top plate 7, the etching reaction product adheres in larger thickness to the center part of the surface of the top plate 7 serving as the inner wall surface of the chamber than to the periphery of the top plate 7. However, by applying higher power to the second FS electrode 9 than to the first FS electrode 8 as in the present embodiment, the etch rate for the reaction product adhered to the center part of the top plate 7 becomes higher than the etch rate for the reaction product adhered to the periphery of the top plate 7. That is, the reaction product is etched uniformly over the entire surface of the top plate 7 by optimizing the power applied to the two FS electrodes 8 and 9. Therefore, the reaction product is completely removed eventually and the excessive etching of the insulating material forming the top plate 7 is avoided.

Figure 3A:
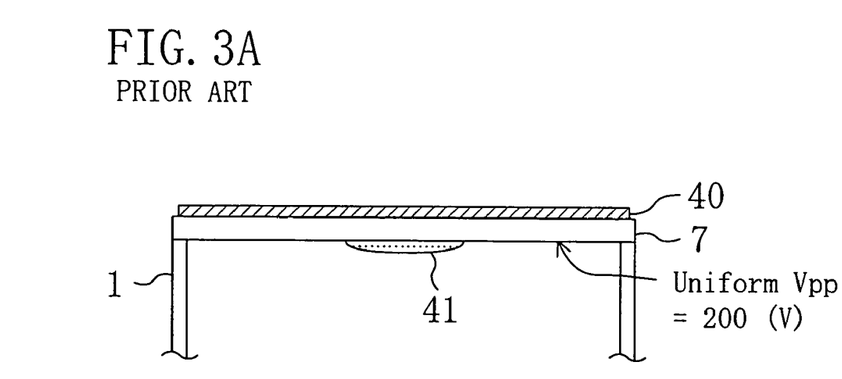
FIG. 3A is a view illustrating a degree of adhesion of a reaction product during etching in a conventional plasma etching apparatus and FIG. 3B is a view illustrating a degree of adhesion of a reaction product during etching in the plasma etching apparatus according to the first embodiment of the present invention.
Figure 3B:
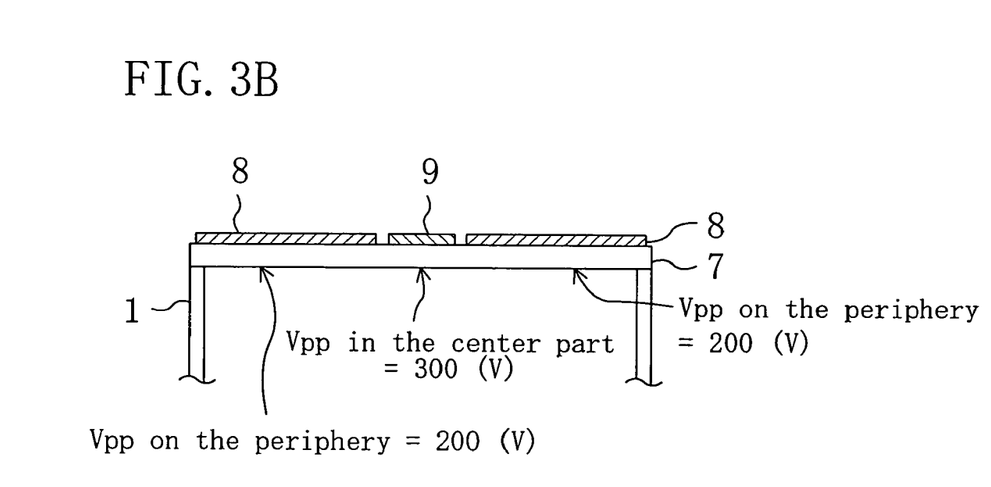

FIGS. 3A and 3B illustrate the state of the surface of the top plate 7 serving as the inner wall surface of the chamber and the vicinity thereof during the etching of the above-described electrode material film made of Ir and Pt for forming a ferroelectric memory device, for example. FIG. 3A shows the state where the conventional plasma etching apparatus (see FIG. 5A) is used, while FIG. 3B shows the state where the plasma etching apparatus according to the present embodiment (see FIG. 1A) is used.

As shown in FIG. 3A, with the conventional apparatus, high frequency power is applied uniformly to the entire surface of the FS electrode 40, whereby a self-bias potential Vpp takes a uniform value of 200 V. Accordingly, among the Ir- or Pt-containing etching reaction product adhered unevenly to the surface of the top plate 7 due to the relative arrangement of the wafer 3 (not shown) and the top plate 7, the etching reaction product 41 adhered to the center part of the surface of the top plate 7 cannot be removed.

On the other hand, as shown in FIG. 3B, when the etching apparatus of the present embodiment is used, high frequency power is applied independently to each of the first and second FS electrodes 8 and 9 depending on the thickness of the reaction product adhered to the surface of the top plate 7. Accordingly, the self-bias potential Vpp caused by the high frequency power is set to 300 V at the center part of the top plate 7 and 200 V at the periphery of the top plate 7. Thereby, the etch rate for the reaction product is adjusted depending on where the reaction product is adhered such that the reaction product can be removed uniformly in the same period of time. In other words, the etching reaction product is etched uniformly over the entire surface of the top plate 7 regardless of the thickness distribution of the reaction product, whereby the reaction product hardly adheres to the top plate 7.

As a result of etching according to the above-described plasma etching process of the present embodiment, the number of particles of 0.2 μm diameter or more increased on a 8-inch circular wafer was about 20 as shown in Table 2. On the other hand, when the conventional plasma etching apparatus shown in FIG. 5A was used to carry out the etching by applying high frequency power to the FS electrode 40, the number of particles of 0.2 μm diameter or more increased on a 8-inch circular wafer was about 500. Thus, as compared with the prior art, the present embodiment allows significant reduction of the number of particles generated.

As described above, according to the present embodiment, the FS electrodes 8 and 9 are used and high frequency power is applied independently to each of the FS electrodes 8 and 9 based on the thickness distribution of the reaction product adhered to the chamber inner wall. As a result, the reaction product remaining in the chamber 1 is etched enough while part of the chamber inner wall (top plate 7) immediately below the ICP coil 5 is prevented from being etched. Accordingly, the particle generation derived from the reaction product is suppressed while an original function of the FS electrode is exerted, i.e., the waste of the insulating material forming the chamber 1 including the top plate 7 is prevented with reliability. Thus, the plasma etching of the electrode material film can be carried out at low costs with fewer defects. In particular, in manufacturing an electrode of a ferroelectric memory, the present embodiment shows a remarkable effect if applied to the etching of a noble metal film or a platinum group metal film which gives a reaction product whose boiling point is too high for easy vaporization, i.e., a reaction product hard to exhaust out of the chamber.

In the present embodiment, the ring-shaped first FS electrode 8 and the disc-shaped second FS electrode 9 are used in combination, but it goes without saying that the number and shape of the FS electrode are not particularly limited. However, if the surface of the substrate placed on the substrate support (electrode 2) is arranged to be opposed to the FS electrode as in the present embodiment, it is preferred to use a plurality of concentrically combinable FS electrodes, especially those having circular circumferences, respectively. With this arrangement, the high frequency power can easily be applied independently to each of the FS electrodes based on the thickness distribution of the reaction product adhered to the chamber inner wall.

In the present embodiment, a detection means may be provided for detecting the etching reaction product adhered to the surface of the top plate 7 serving as the inner wall surface of the chamber (e.g., a photodetector 24 according to a second embodiment).

Further, in the present embodiment, the electrode material film is etched while the high frequency power is applied to each of the first and second FS electrodes 8 and 9 to remove the reaction product. However, as an alternative to this process, the layered electrode material film may be first etched as shown in FIG. 2B, and the high frequency power may be then applied independently to each of the first and second FS electrodes 8 and 9 to remove the reaction product generated through the etching while the semiconductor substrate provided with the layered electrode material film is mounted on the electrode 2 in the chamber 1 of the etching apparatus shown in FIG. 1A or after it is taken out of the chamber 1. Also in this case, the step following the removal of the reaction product is the same as that explained with reference to FIG. 2C.

Second Embodiment

Hereinafter, an explanation is given to a plasma etching apparatus and a plasma etching process according to a second embodiment of the present invention with reference to the drawings.

Figure 4A:
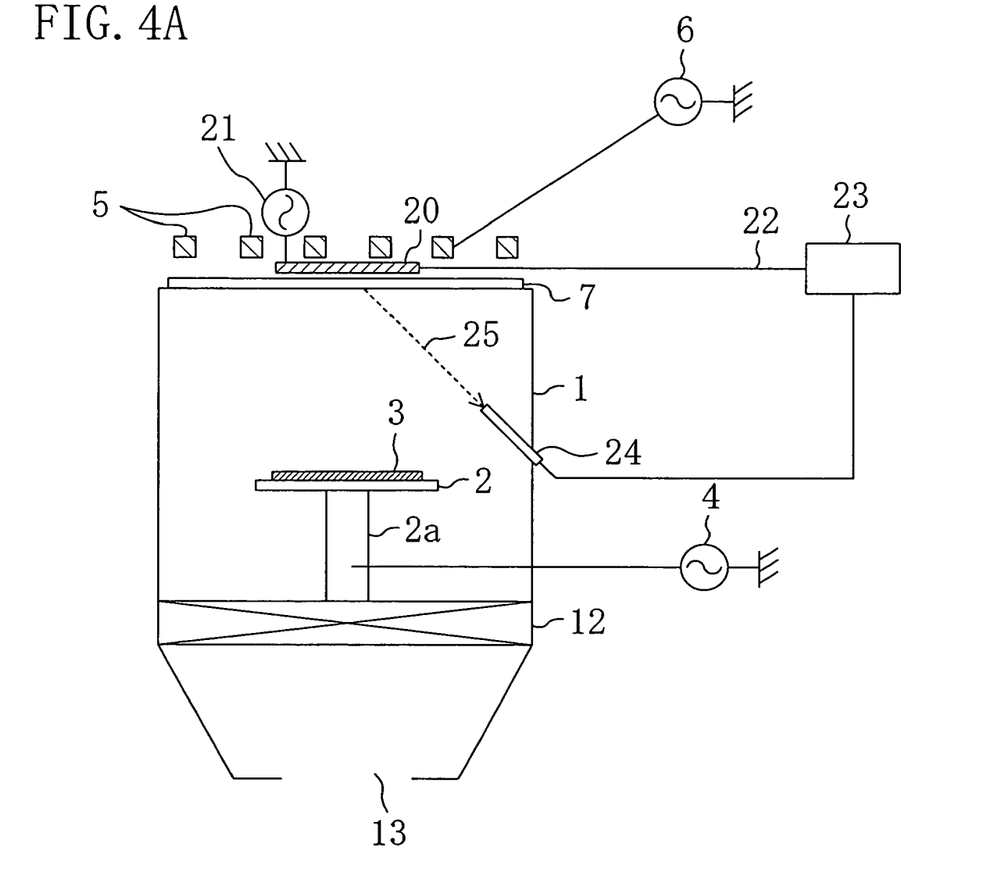
FIG. 4A is a view illustrating a schematic configuration of a plasma etching apparatus according to a second embodiment of the present invention and FIG. 4B is a plan view illustrating an FS electrode of the etching apparatus shown in FIG. 4A.

FIG. 4A is a view illustrating a schematic configuration of a plasma etching apparatus according to the second embodiment of the present invention. The plasma etching apparatus of the present embodiment allows generation of plasma which couples inductively with an ICP coil and plasma which couples capacitively with an FS electrode. Major features thereof are that the FS electrode moves in a creeping manner along a top plate at the top of a chamber 1 and that a device for monitoring in-situ a deposit adhered to the top plate (etching reaction product) is provided. That is, according to the etching process of the present invention, the etching is carried out while the step is repeated of specifying a position on the top plate where the reaction product is adhered by the in-situ monitoring and moving the FS electrode to the position to remove the reaction product.

More specifically, as shown in FIG. 4A, the apparatus of the present embodiment includes an electrode 2 serving also as a wafer support arranged in a chamber 1 for performing plasma treatment such as dry etching, i.e., a chamber 1 capable of reducing pressure. The electrode 2 is installed on the bottom of the chamber 1 via a support member 2a. Further, a wafer 3 to be plasma-treated is placed on the electrode 2 and a high frequency bias voltage is applied to the electrode 2 from a high frequency power source 4.

At the top of the chamber 1, a top plate 7 made of quartz or ceramic is provided to be opposed to the electrode 2 or the wafer 3. A high frequency electrode for generating major plasma in the chamber 1 to etch the wafer 3, i.e., an ICP coil 5, is provided in proximity to the top surface of the top plate 7, i.e., an outer wall of the chamber 1. A high frequency voltage (high frequency power) is supplied to the ICP coil 5 from a high frequency power source 6.

An FS electrode 20 is inserted between the ICP coil 5 and the top plate 7. The FS electrode 20 may be spaced from the top plate 7 or in contact with the top plate 7 depending on the material of the top plate 7.

During the etching of the wafer 3, a suitably adjusted high frequency voltage (high frequency power) is applied to the FS electrode 20 from a high frequency power source 21, which prevents the insulating material, especially forming the top plate 7, from being etched by plasma ion impact and removes the reaction product adhered to the surface of the top plate 7 serving as the inner wall surface of the chamber 1.

A first feature of the apparatus of the present embodiment is that the apparatus includes a drive unit 23 for moving the FS electrode 20 between the top plate 7 and the ICP coil 5 along the surface of the top plate 7. The drive unit 23 is connected to the FS electrode 20 via an arm 22 operatively connected with the drive unit 23.

Figure 4B:
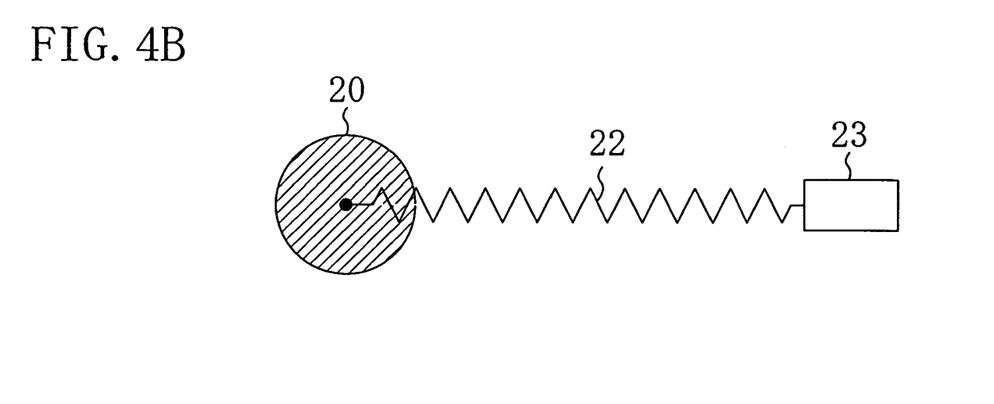

FIG. 4B is a plan view of the FS electrode 20 of the etching apparatus shown in FIG. 4A. As shown in FIG. 4B, the FS electrode 20 is disc-shaped when viewed in plan. In general, the FS electrode 20 is preferably in such a shape.

A second feature of the apparatus of the present embodiment is that the apparatus includes, on the side of the chamber 1, a detection means for detecting the etching reaction product adhered to the surface of the top plate 7 serving as the inner wall surface of the chamber, to be more specific, a photodetector 24. Though not shown, an optical sensor device such as a CCD (charge-coupled device) is mounted to the tip of the photodetector 24. When the reaction product is adhered to the surface of the top plate 7 during the etching, the optical sensor device reads a periodical change over time of interference light 25 caused by an interference phenomenon of lights reflected from the upper and lower surfaces of a film of the adhered reaction product (change in film interference signal), with light emitted by the plasma as a light source. Thereby, the degree of growth of the adhered film is detected. Further, since the photodetector 24 is operatively connected with the drive unit 23, the film interference signal detected by the photodetector 24 is fed back to the drive unit 23 to move the FS electrode 20 appropriately. More specifically, the angle of the photodetector 24 (direction for measuring the interference light 25) is changed over time during the etching to scan the whole surface of the top plate 7 and the growth of the adhered film is monitored based on the thus obtained periodical change in the interference light 25. Then, based on the change in the interference light 25 detected by the photodetector 24, the drive unit 23 moves the FS electrode 20 via the arm 22 to a position where the adhered film has grown large. Thus, the adhered film in that position, i.e., the reaction product, is removed.

The etching apparatus shown in FIG. 4A has an exhaust port 13 at the bottom thereof. Releasing a gate valve 12 brings a pressure-reduced state in the chamber 1.

The steps of manufacturing a capacitive element (memory capacity) of a ferroelectric memory cell which employs a ferroelectric film made of SBT or PZT as an insulating film for the capacitive element using the plasma etching apparatus of the present embodiment shown in FIG. 4A are basically the same as those of the first embodiment shown in FIGS. 2A to 2C. However, in detail, the step corresponding to the step shown in FIG. 2B is different.

More specifically, in the present embodiment, the same step as that of the first embodiment shown in FIG. 2A is carried out, and then in the step shown in FIG. 2B, the Pt film 34, $IrO_2$ film 33 and Ir film 32 are etched in sequence under different etching conditions from those of the first embodiment to form a lower capacitive electrode. Specific etching conditions are shown in Table 3.

TABLE 3

| ICP/RF power | 1500 W/200 W, 13.56 MHz |
| --- | --- |
| FS electrode power | 500 W, 12.56 MHz |
| $Cl_2/O_2$ Flow rate | 100 ml/min (standard conditions)/ 250 ml/min (standard conditions) |
| Pressure | 2.0 Pa |
| Temperature of lower electrode | 50° C. |
| Number of particles increased | 0.2 µm or more: 20 particles |

As shown in Table 3, in the dry etching process according to the present embodiment, high frequency power of 500 W (at a frequency of 12.56 MHz) is applied to the FS electrode 20 to perform the etching. In Table 3, the lower electrode corresponds to the electrode 2 of the plasma etching apparatus shown in FIG. 4A. That is, during the etching, high frequency power of 1500 W (at a frequency of 13.56 MHz) is applied to the ICP coil 5 and high frequency power of 200 W (at a frequency of 13.56 MHz) is applied to the lower electrode (electrode 2) so as to control energy of ions in the etching gas entering the substrate. Further, as seen in Table 3, $Cl_2$ gas and $O_2$ gas are introduced at flow rates of 100 ml/min (normal state) and 250 m/min (normal state), respectively. The pressure in the chamber 1 is 2.0 Pa and the temperature of the lower electrode is 50° C.

More specifically, in the dry etching process of the present embodiment, the ICP coil 5 and the electrode 2 are applied with the high frequency power, respectively, to generate plasma. In addition, while a certain high frequency power is being applied to the FS electrode 20, the whole surface of the top plate 7 is scanned by the photodetector 24 to detect thickness distribution of the reaction product containing Pt or Ir. The etching process may be carried out while the FS electrode 20 is moved to a position where the reaction product has grown relatively large based on the detection result to effectively remove the reaction product in that position. Or alternatively, the etching process may be carried out while the high frequency power applied to the FS electrode 20 is varied depending on the thickness of the reaction product adhered to the position where the FS electrode 20 has been moved to (more specifically, the high frequency power applied is increased as the thickness of the reaction product becomes larger). In any case, the etching reaction product is etched uniformly over the whole surface of the top plate 7 regardless of the thickness distribution thereof. Thus, the reaction product hardly adheres to the top plate 7.

The step following to the above-described etching step is the same as the step of the first embodiment shown in FIG. 2C.

The above explanation is based on the premise that a single photodetector 24 is used. However, two or more photodetectors 24 may be used to divide the range of detection of the interference light 25 by the photodetectors 24 into the center part and the periphery of the top plate 7, for example. If such division is made, the degree of growth of the adhered reaction product film is detected with more efficiency, which allows more efficient removal.

As described above, according to the present embodiment, the in-situ monitoring is carried out using the photodetector 24 during the etching of the layered film containing Ir or Pt to specify a position on the top plate 7 where the deposit (etching reaction product) is adhered, and then the FS electrode 20 is moved to the specified position as needed to remove the deposit. Thus, the etching of the layered film is carried out while the removal of the deposit is repeated. That is, since the etching of the reaction product by the FS electrode 20 is carried out only on the position of the top plate 7 where the reaction product is adhered, the reaction product, which is adhered unevenly, is completely etched away while the waste of part of the insulting material forming the top plate 7 or the chamber 1 to which the reaction product is not adhered is prevented. Thus, the particle generation derived from the reaction product is suppressed while an original function of the FS electrode 20 is exerted, i.e., the waste of the insulating material forming the chamber 1 including the top plate 7 is prevented with reliability. Thereby, the plasma etching of the electrode material film is carried out at low costs with fewer defects. In particular, in manufacturing an electrode of a ferroelectric memory, the present embodiment shows a remarkable effect if applied to the etching of a noble metal film or a platinum group metal film which gives a reaction product whose boiling point is too high for easy vaporization, i.e., a reaction product hard to exhaust out of the chamber.

As a result of etching according to the above-described plasma etching process of the present embodiment, the number of particles of 0.2 µm diameter or more increased on a 8-inch circular wafer was about 20 as shown in Table 3. On the other hand, when the conventional plasma etching apparatus shown in FIG. 5A was used to carry out the etching by applying the high frequency voltage to the FS electrode 40, the number of particles of 0.2 µm diameter or more increased on a 8-inch circular wafer was about 500. Thus, as compared with the prior art, the present embodiment allows significant reduction of the number of particles generated.

In the second embodiment, the reaction product is removed simultaneously with the etching of the electrode material film by moving the FS electrode 20 and applying high frequency power thereto. However, alternatively, the layered electrode material film may be first etched as shown in FIG. 2B, and the removal of the reaction product generated during the etching may be then carried out by moving the FS electrode 20 and applying high frequency power to the FS electrode 20, while the semiconductor substrate provided with the layered electrode material film is mounted on the electrode 2 in the chamber 1 of the etching apparatus shown in FIG. 4A or after it is taken out of the chamber 1. Also in this case, the step following the removal step of the reaction product is the same as the step shown in FIG. 2C.

Further, in the second embodiment, the photodetector 24 is provided as a detection means for detecting the etching reaction product adhered to the surface of the top plate 7 serving as the inner wall surface of the chamber. However, it is needless to say that the detection means is not limited to the photodetector 24. Further, the thickness distribution of the etching reaction product may be obtained without using the detection means such as the photodetector 24.

In the first and second embodiments, it goes without saying that the film to be etched is not limited to the film containing a noble metal element or a platinum group element. That is, in the first and second embodiments, an object to be etched is an electrode material film which gives the etching reaction product whose boiling point is too high for easy vaporization (i.e., which remains easily). However, it is needless to say that the same effect is obtained if a material film used in other semiconductor manufacturing processes or material production process is targeted. Likewise, the kind of etching gas used in the first and second embodiments is not particularly limited to the gas mixture of $Cl_2$ gas and $O_2$ gas and other chlorine-containing gas may be used.

In the first and second embodiments, targeted is an etching apparatus including the ICP coil and the FS electrode (inductively coupled plasma etching apparatus), but the present invention is not limited thereto. The present invention can be applied to any etching apparatus including a first electrode provided outside the chamber and applied with high frequency power for generating plasma in the chamber and a second electrode provided between the chamber and the first electrode and applied with high frequency power.

What is claimed is:

1. A plasma etching process using a plasma etching apparatus comprising a chamber capable of reducing pressure; a substrate support provided inside the chamber to place a substrate; a first electrode which is arranged outside and in proximity to the chamber and to which high frequency power is applied to generate plasma of an etching gas in the chamber; and a second electrode comprising a plurality of separated electrodes which are arranged between the chamber and the first electrode and to each of which high frequency power is applied independently, the process comprising the steps of:
   placing a substrate provided with a film to be etched on the substrate support;
   introducing an etching gas into the chamber and applying high frequency power to the first electrode after the step of placing the substrate to generate plasma of the etching gas in the chamber; and
   etching the film to be etched with the plasma while applying high frequency power independently to each of the plurality of separated electrodes serving as the second electrode based on the thickness distribution of an etching reaction product adhered to part of an inner wall of the chamber opposing to the second electrode.

2. A plasma etching process according to claim 1, wherein in the step of applying the high frequency power independently to each of the plurality of separated electrodes, uniform etching is carried out to the etching reaction product regardless of the thickness distribution of the etching reaction product.

3. A plasma etching process according to claim 1, wherein the film to be etched is a film containing at least a noble metal element or a platinum group element and the etching gas is a chlorine-containing gas.

4. A plasma etching process using a plasma etching apparatus comprising a chamber capable of reducing pressure; a substrate support provided inside the chamber to place a substrate; a first electrode which is arranged outside and in proximity to the chamber and to which high frequency power is applied to generate plasma of an etching gas in the chamber; and a second electrode comprising a plurality of separated electrodes which are arranged between the chamber and the first electrode and to each of which high frequency power is applied independently, the process comprising the steps of:

placing a substrate provided with a film to be etched on the substrate support;

introducing an etching gas into the chamber and applying high frequency power to the first electrode after the step of placing the substrate to generate plasma of the etching gas in the chamber;

etching the film to be etched with the plasma; and applying high frequency power independently to each of the plurality of separated electrodes serving as the second electrode based on the thickness distribution of an etching reaction product adhered to part of an inner wall of the chamber opposing to the second electrode after the step of etching the film to be etched.

5. A plasma etching process according to claim 4, wherein in the step of applying the high frequency power independently to each of the plurality of separated electrodes, uniform etching is carried out to the etching reaction product regardless of the thickness distribution of the etching reaction product.

6. A plasma etching process according to claim 4, wherein the film to be etched is a film containing at least a noble metal element or a platinum group element and the etching gas is a chlorine-containing gas.

7. A plasma etching process using a plasma etching apparatus comprising a chamber capable of reducing pressure; a substrate support provided inside the chamber to place a substrate; a first electrode which is arranged outside and in proximity to the chamber and to which high frequency power is applied to generate plasma of an etching gas in the chamber; a second electrode which is arranged between the chamber and the first electrode and to which high frequency power is applied; and a drive mechanism for moving the second electrode between the chamber and the first electrode alone a wall of the chamber, the process comprising the steps of:

placing a substrate provided with a film to be etched on the substrate support;

introducing an etching gas into the chamber and applying high frequency power to the first electrode after the step of placing the substrate to generate plasma of the etching gas in the chamber; and etching the film to be etched with the plasma and simultaneously applying high frequency power to the second electrode while moving the second electrode along a wall of the chamber using the drive mechanism based on the thickness distribution of an etching reaction product adhered to part of an inner wall of the chamber opposing to the second electrode.

8. A plasma etching process according to claim 7, wherein in the step of applying the high frequency power to the second electrode, uniform etching is carried out to the etching reaction product regardless of the thickness distribution of the etching reaction product.

9. A plasma etching process according to claim 7, wherein the film to be etched is a film containing at least a noble metal element or a platinum group element and the etching gas is a chlorine-containing gas.

10. A plasma etching process using a plasma etching apparatus comprising a chamber capable of reducing pressure; a substrate support provided inside the chamber to place a substrate; a first electrode which is arranged outside and in proximity to the chamber and to which high frequency power is applied to generate plasma of an etching gas in the chamber; a second electrode which is arranged between the chamber and the first electrode and to which high frequency power is applied; a detection means for detecting an etching reaction product adhered to part of an inner wall of the chamber opposing to the second electrode; and a drive mechanism for moving the second electrode between the chamber and the first electrode alone a wall of the chamber in response to an etching reaction product detection signal from the detection means, the process comprising the steps of:

placing a substrate provided with a film to be etched on the substrate support;

introducing an etching gas into the chamber and applying high frequency power to the first electrode after the step of placing the substrate to generate plasma of the etching gas in the chamber; and etching the film to be etched with the plasma and simultaneously detecting the thickness distribution of an etching reaction product adhered to part of an inner wall of the chamber opposing to the second electrode using the detection means and applying high frequency power to the second electrode while moving the second electrode along a wall of the chamber using the drive mechanism based on the detected thickness distribution.

11. A plasma etching process according to claim 10, wherein in the step of applying the high frequency power to the second electrode, uniform etching is carried out to the etching reaction product regardless of the thickness distribution of the etching reaction product.

12. A plasma etching process according to claim 10, wherein the film to be etched is a film containing at least a noble metal element or a platinum group element and the etching gas is a chlorine-containing gas.

* * * * *